United States Patent [19]

Ataka et al.

[11] Patent Number: 5,271,795
[45] Date of Patent: Dec. 21, 1993

[54] METHOD OF GROWING CRYSTALS

[75] Inventors: Mitsuo Ataka; Michihiko Asai, both of Tsukuba; Masaki Kato; Kazuhide Kamimura, both of Kobe, all of Japan

[73] Assignees: Mitsubishi Jukogyo Kabushiki Kaisha; Agency of Industrial Science and Technology, both of Tokyo, Japan

[21] Appl. No.: 759,379

[22] Filed: Sep. 13, 1991

[30] Foreign Application Priority Data

Sep. 14, 1990 [JP] Japan .................... 2-242807

[51] Int. Cl.$^5$ ............................ C30B 29/54
[52] U.S. Cl. ................. 156/621; 156/600; 156/DIG. 113; 23/295 R
[58] Field of Search ........... 156/621, 600, DIG. 113; 23/295 R

[56] References Cited

U.S. PATENT DOCUMENTS

| | | | |
|---|---|---|---|
| 3,101,259 | 8/1963 | Sawyer | 23/295 R |
| 3,374,067 | 3/1968 | Johnsen et al. | 23/295 R |
| 5,104,478 | 4/1992 | Sikdar et al. | 156/DIG. 113 |
| 5,120,650 | 6/1992 | Visuri | 435/176 |

OTHER PUBLICATIONS

Svanoe, "Crystallization of Organic Compounds From Solutions", Journal of Chemical Education., Oct. 1950 549–553.

Leray "Growth Kinetics of Hydrated Cupric Chloride", Journal of Crystal Growth vol. 3,4 (1968) pp. 344–349.

Brice, *Crystal Growth Processes* Blackie and Sons Glasgow 1986, pp. 181 to 183.

Mitsuo Ataka and Shoji Tanaka; Biopolymer, vol. 25, p. 349, lines 18 to 20, 1986 (no month).

Mitsuo Ataka and Michihiko Asai; Journal of Crystal Growth 90 (1988), no month pp. 92 and 93, first paragraph of section 4.4.

Franz Rosenberger and Edward J. Meehan; Journal of Crystal Growth 90 no month (1988), section 3, p. 76.

*Primary Examiner*—Robert Kunemund
*Attorney, Agent, or Firm*—McAulay Fisher Nissen Goldberg & Kiel

[57] ABSTRACT

A method of growing crystals utilizing the temperature dependence of solubility of a crystalline material which is characterized in that crystals are deposited by locally controlling the temperature of a solution containing the crystalline material to take a suitable value. Larger crystals can be formed.

4 Claims, 5 Drawing Sheets

—·—·— : SOLUBILITY CURVE WITH 3% NaCl

———— : TESTED LYSOZYME CONC. (3%)

METHOD OF GROWING CRYSTALS

BACKGROUND OF THE INVENTION

1. Field of the Invention

This invention relates to a method of growing crystals.

2. Description of the Related Art

As a representative example of conventional methods of growing crystals, we describe the method proposed in Japanese Patent Publication No. 1082/1980 (55-1082) with reference to FIG. 5.

In this method, as shown in FIG. 5(a), a solution 1 containing crystalline material is filled in an elongated container 2 like a tube. One end of this container is cooled and the other end is heated to give the test solution a temperature gradient so that crystals would form in a region where the degree of supersaturation is large. FIG. 5(a) describes this method, (b) illustrates the temperature gradient produced in the method, and (c) shows the solubility when the crystalline material is lysozyme.

The solubility of a crystalline material changes with temperature. For example, albumen (egg white) lysozyme changes its saturation solubility with temperature as shown in FIG. 6.

When a crystalline material is dissolved in a solution so as to become supersaturated, the amount of molecules which is in excess beyond the solubility form crystals. If we provide a test solution with some temperature gradient, crystallization begins where the solubility is small. In the region where the concentration exceeds the solubility, even though it may be late to start, crystallization eventually begins.

Because temperature varies moderately according to a conventional method, the degree of supersaturation also changes gradually and crystals form in an extended area. Therefore, the number of crystals is large in comparison with the amount of the crystalline material, and therefore the crystals do not grow sufficiently large.

For example, when a solution which contains 3% of albumen lysozyme (which is a protein) as a crystalline material and 3% of sodium chloride as an auxiliary agent and the pH value of which is adjusted to 4.6 using HCl was placed in a container 2 having a length of 220 mm and an inner diameter of 12 mm and given a linear temperature gradient of 1.3° C./cm which is a result of 7° C. at the cooling end and 35° C. at the heating end, more than 1,000 crystals per centimeter were observed in the portion where the temperature is 20° C. or less and which is not more than 10 cm from the 7° C. cooling end. If the temperature is over 20° C., the number of crystals decreases considerably and no crystals were observed near 30° C.

If we assume that 1,000 pieces per centimeter of crystals formed in the region where the temperature is 20° C. or less and that no crystals formed above 20° C., it can be calculated that 10,000 crystals formed from 0.75 g of albumen lysozyme. Without the temperature gradient, 22,000 crystals can form from 0.75 g of albumen lysozyme. Therefore, while the effect of the added temperature gradient can be recognized, the number of crystals is still large and it is not possible to form dramatically large crystals.

SUMMARY OF THE INVENTION

In view of the state of the art described above, the object of this invention is to provide a crystallization method with which sufficiently large crystals can be grown.

The present inventors have, as a result of intensive study to find a solution to the above problems, found the following.

In order to make crystals larger without increasing the amount of the crystalline material, the number of crystals should be reduced. Because the solubility varies with temperature, if the degree of supersaturation is increased by local heating or cooling, crystals form only locally and their number can be reduced, increasing the size of crystals. Furthermore, if other regions are kept at such temperatures that do not cause supersaturation at all or that cause only a small degree of supersaturation, crystals do not form in such regions. Therefore, the portion of crystalline material which exists in excess beyond the local solubility in one region is used to form crystals there, and larger crystals can be obtained.

This invention has been made based on the above finding and provides:

(1) A method of growing crystals utilizing the temperature dependence of the solubility of a crystalline material which is characterized in that crystals are deposited by locally controlling the temperature of a solution containing the crystalline material at a desirable temperature value.

(2) The method described in (1) above, which is further characterized by controlling the temperature of a region other than a locality where temperature is locally controlled at the desirable temperature value at a temperature value which is unsuitable for crystal formation.

A crystalline material changes its solubility to a solvent depending on temperature. When a solution is heated or cooled locally, the degree of supersaturation of a crystalline material can be increased in a very small region.

If the degree of supersaturation is large, the time it takes for crystals to appear becomes shorter and crystal growth speeds up as well. Therefore, crystals start growing first in the region where the temperature is controlled to take the most desirable value. In this region, because the crystalline material turns into crystals, its concentration in the solution phase decreases. In other region, because no crystals are growing, the concentration of the crystalline material remains the same as its initial value.

Therefore, molecules of the crystalline material present in other regions are supplied to the region where the temperature is locally controlled to take the desirable value because of local temperature and concentration differences, and those molecules are used for crystal growth so as to make the crystals larger in a solution.

There exist two mechanisms for the transport of crystalline material molecules.

One is heat convection. There exists a temperature distribution in the solution because temperature is different in the region where temperature is controlled at a desirable value and other regions, and this temperature distribution causes heat convection. Due to this heat convection, solution moves between other regions and the region where the temperature is controlled at the desirable value. Therefore, the crystalline material molecules present in other regions are supplied to the region where temperature is controlled at the desirable value and are used in crystal growth.

The other is diffusion. Diffusion takes place because of differences in the concentration of the crystalline material. Crystalline material molecules move from a region where the concentration is high to another region where the concentration is low. Those molecules are utilized in crystal growth.

Because of the heat convection and the diffusion, crystalline material molecules are supplied from other regions to the region where temperature is controlled at the desirable value and used in growing crystals. Because the number of crystals formed per unit volume depends on the degree of supersaturation and temperature and the like, even if the crystalline material is supplied from surrounding regions, such supply does not lead to an increase in the number, but is used for the growth of crystals. Therefore, the number of molecules constituting one crystal increases, and thus crystals grow larger than by conventional methods.

Also, when crystals are formed, because the condition of the solution surrounding the crystals in growth should not be disturbed in order to obtain good crystals, it has been difficult to supply a crystalline material. According to this invention, it has become possible to control the number of crystals grown and supply the crystalline material without disturbing the condition of the surrounding solution around the growing crystals. Thus, it has become possible to produce larger crystals.

DETAILED DESCRIPTION OF THE PREFERRED EMBODIMENTS

Figure 1A:
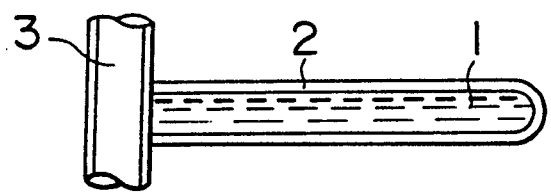
FIGS. 1(a), (b), (c) show a schematic diagram of the T-shaped crystal growing apparatus according to a first embodiment of the present invention and graphs for describing the operation thereof.

FIG. 1 shows a first embodiment of the present invention. As shown in FIG. 1(a), a solution containing a crystalline material is placed in a tube-like container 2. This container 2 has a tube 3 attached to form a T shape at one end.

If the solubility of the crystalline material decreases with decreasing temperature, when cooling water is supplied to the tube 3, only the portion of the container 2 which is close to the tube 3 is locally cooled, and only in this portion the supersaturation becomes large and crystals form.

For example, when a solution containing 3% of albumen lysozyme, which is a protein, as crystalline material, and 3% of sodium chloride as an auxiliary agent, and the pH of the solution being adjusted to 4.6 by hydrogen chloride, was placed in the container 2 of 220 mm length and 12 mm inner diameter. Cooling water of 2° C. flowed in the tube 3 and crystals were formed at room temperatures of 20° to 30° C. The solution showed such solubility as shown in FIG. 1(c). Crystals formed in an area within about 20 mm from the portion in contact with the tube 3.

Figure 1B:
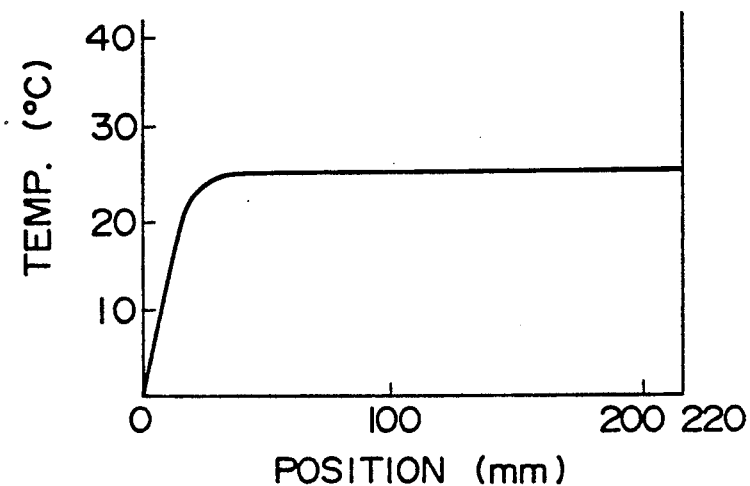
Figure 1C:
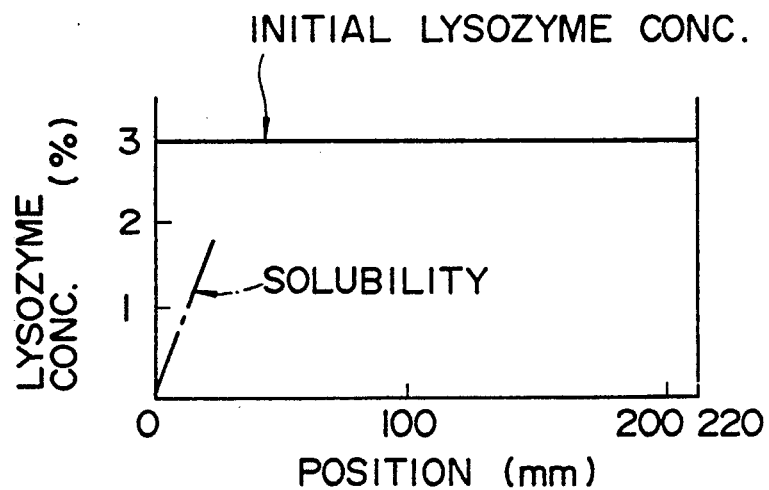
Figure 5A:
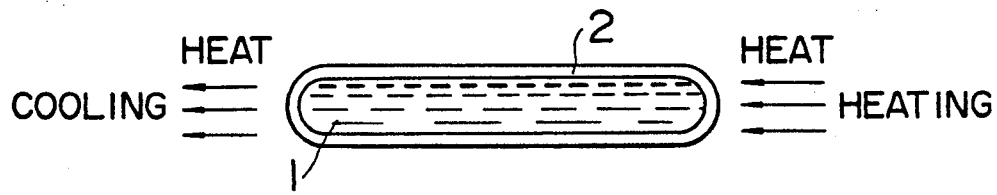
FIGS. 5(a), (b), and (c) show a schematic diagram of a conventional apparatus and graphs describing the operation thereof.
Figure 5B:
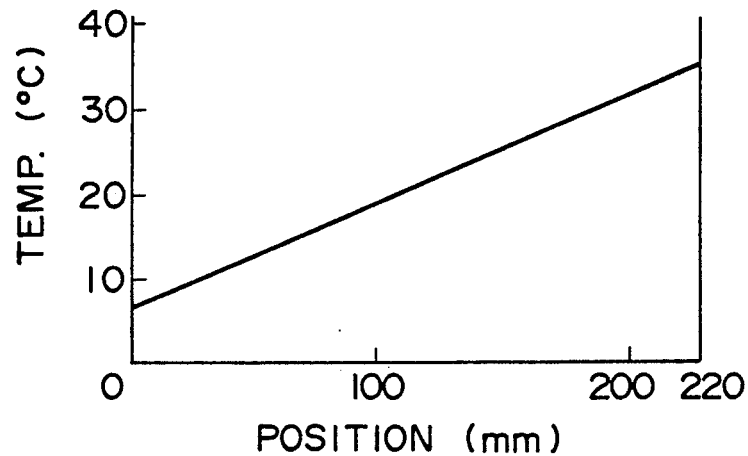
Figure 5C:
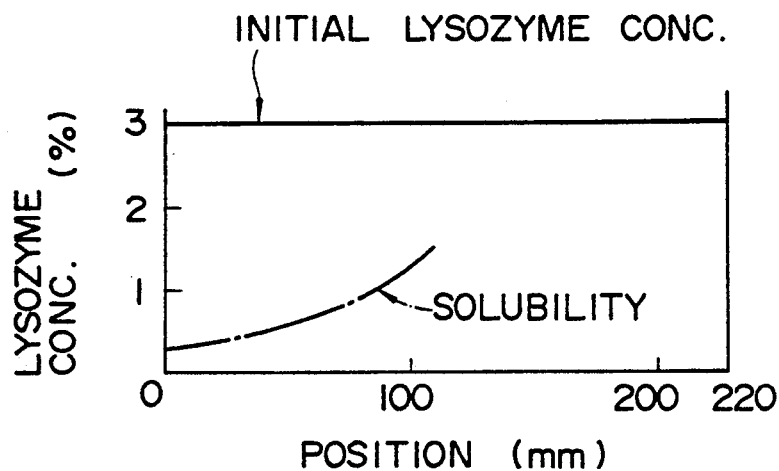
Figure 6:
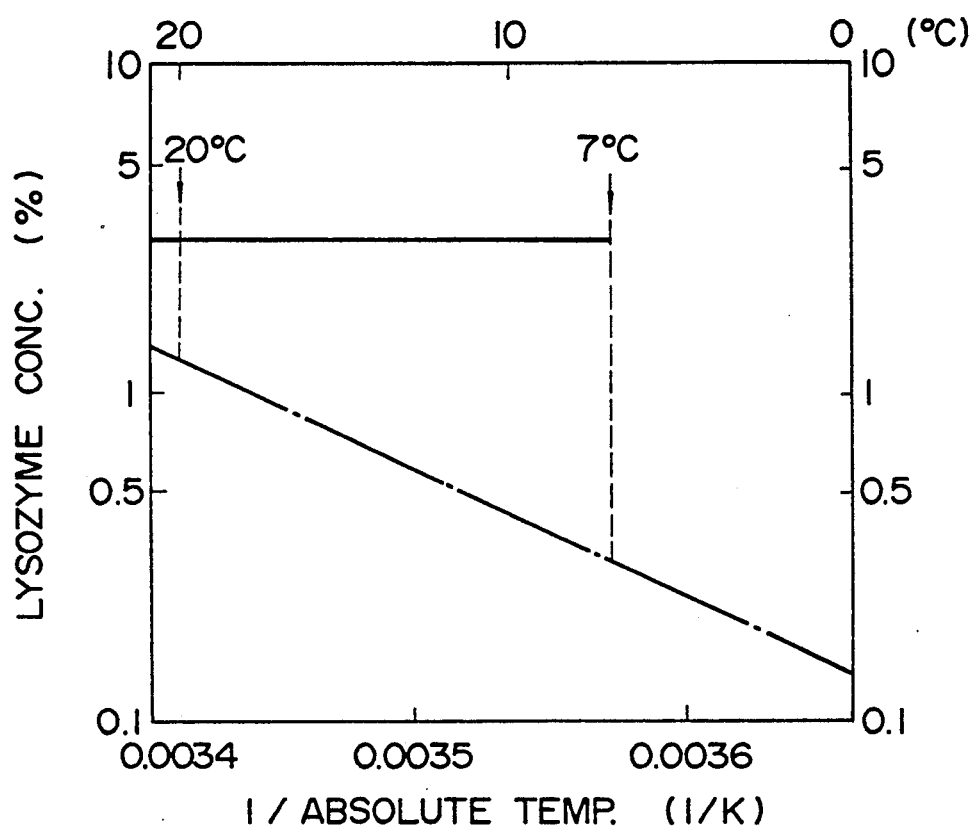
FIG. 6 is a solubility curve for albumen (egg white) lysozyme.

Differences between the conventional method and the method of local cooling should become clear if we compare FIG. 5(c) and FIG. 1(c) as well as FIG. 5(b) and FIG. 1(b). Due to these differences, it was possible to obtain much larger crystals when the solution was cooled locally. If we assume that 1,000 crystals formed per cubic centimeter ($cm^3$), it can be calculated that 2,000 crystals formed from 0.75 g of albumen lysozyme. According to the conventional method of linear temperature gradient, 10,000 crystals form from 0.75 g of albumen lysozyme. A simple arithmetic suggests that crystals by the method of this invention are five times larger than those by the conventional method.

On the contrary to albumen lysozyme, if the solubility of a crystalline material decreases with increasing temperature, warm water is supplied to the tube 3 so as to locally increase the degree of supersaturation and form larger crystals.

In FIG. 1 local cooling or heating is done by cooled or warm water. However, it is also possible to control temperature by a Peltier element or a heater.

Figure 2:
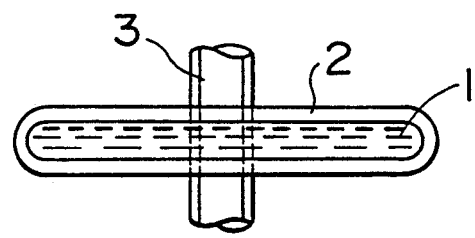
FIG. 2 shows the cross-shaped crystal growing apparatus according to a second embodiment of the present invention.

In FIG. 1(a), the tube 3 is attached to an end of the container 2 in order to control temperature. It is also possible to attach a tube 3 in the middle portion of the container 2 as shown in FIG. 2. In this case, if the inner diameter and the length of the tube are the same, the distance between the ends of the container and the area where the crystals grow becomes shorter, it is possible to speed up the supply of the crystalline material.

Figure 3:
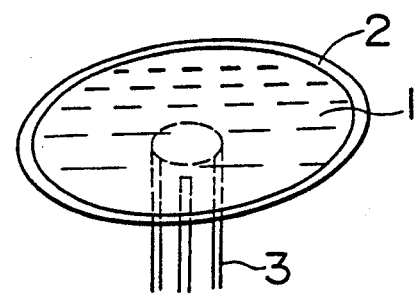
FIG. 3 shows the dish-shaped crystal growing apparatus according to a third embodiment of the present invention.

Furthermore, as shown in FIG. 3, if the container 2 is shaped like a dish, the supply of the crystalline material becomes still faster.

According to the methods shown in FIGS. 1 to 3, it is possible to increase the degree of supersaturation locally. However, because the temperature of the solution in other regions is left uncontrolled, it is determined by the temperature of the surroundings. Therefore, it is not possible to assure that an appropriate degree of supersaturation or undersaturation is maintained.

Figure 4A:
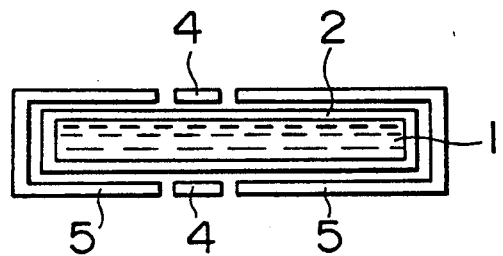
FIGS. 4(a) and (b) show a schematic diagram of a localized crystal growing apparatus according to a fourth embodiment of the present invention and a graph for describing the operation thereof.
Figure 4B:
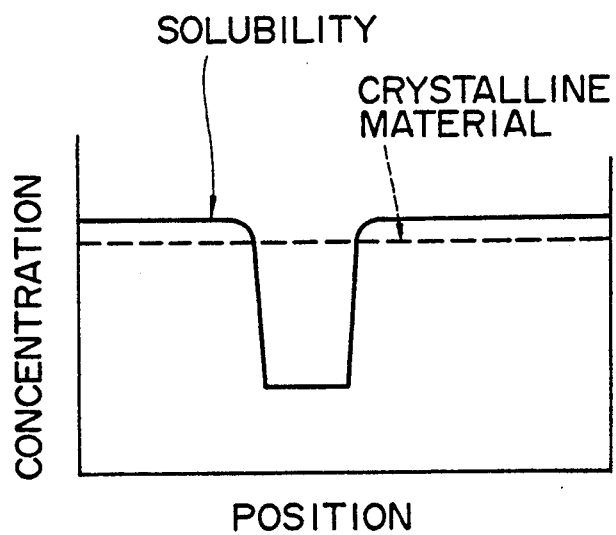

As shown in FIGS. 4(a) and 4(b), if a portion of the container 2 is controlled to have a suitable temperature by a local temperature control device 4 and other parts are controlled to have different temperatures by an overall temperature control device 5, the degree of supersaturation can be increased only in one region of the container 2, and a small degree of supersaturation or an undersaturation condition can be maintained in other regions, so as to restrict the area where crystal actually grow. In this method, crystals would not form in areas other than the area intended for growing crystals, and it is therefore possible to make sure that crystals grow larger.

We claim:

1. A method for growing protein crystals in a vessel utilizing the temperature dependence of solubility of a crystalline protein material which comprises causing the crystals to be deposited from a solution of the protein by controlling the temperature of a localized portion of the solution at a temperature to cause crystal deposition in localized portions and not disturbing the solution surrounding the growing crystals.

2. The method of claim 1 which further comprises controlling the temperature of a region other than the localized portion at a value which is unsuitable for crystal formation.

3. The method of claim 1 wherein the protein is albumen lysozyme.

4. The method of claim 2 wherein the protein is albumen lysozyme.

* * * * *